(12) United States Patent
Johnson

(10) Patent No.: US 7,225,394 B2
(45) Date of Patent: May 29, 2007

(54) VOTING CIRCUIT

(75) Inventor: Tyler James Johnson, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 666 days.

(21) Appl. No.: 10/431,941

(22) Filed: May 8, 2003

(65) Prior Publication Data

US 2004/0225936 A1    Nov. 11, 2004

(51) Int. Cl.
*G06F 11/08* (2006.01)
*G06F 7/02* (2006.01)

(52) U.S. Cl. .................... 714/797; 714/819

(58) Field of Classification Search ................ None
See application file for complete search history.

(56) References Cited

U.S. PATENT DOCUMENTS

| | | | |
|---|---|---|---|
| 4,375,683 A | 3/1983 | Wensley |
| 4,658,400 A | 4/1987 | Brown et al. |
| 4,670,880 A | 6/1987 | Jitsukawa et al. |
| 4,967,717 A | 11/1990 | Miyazaki et al. |
| 5,031,180 A | 7/1991 | Melver et al. |
| 5,086,429 A | 2/1992 | Gray et al. |
| 5,369,654 A | 11/1994 | Millis, Jr. |
| 5,907,671 A | 5/1999 | Chen et al. |
| 5,923,512 A | 7/1999 | Brownlow et al. |
| 6,247,160 B1 | 6/2001 | Davidsson et al. |
| 6,253,348 B1 | 6/2001 | Davidsson et al. |
| 6,326,809 B1 | 12/2001 | Gambles et al. |
| 6,417,710 B1 | 7/2002 | Bartholet |
| 6,504,411 B2 * | 1/2003 | Cartagena ................ 327/199 |
| 6,526,559 B2 | 2/2003 | Schiefele et al. |

FOREIGN PATENT DOCUMENTS

| | | |
|---|---|---|
| GB | 1 397 755 | 6/1975 |
| JP | 62024498 | 7/1987 |
| JP | 10135934 | 10/1996 |
| SU | 892732 | 4/1980 |

OTHER PUBLICATIONS

Search Report under Section 17(5) in GB0408857.1 from the UK Patent Office (date of search Sep. 21, 2004), 3 pages.

* cited by examiner

*Primary Examiner*—Albert Decady
*Assistant Examiner*—John J. Tabone, Jr.

(57) ABSTRACT

A circuit for correcting errors in an N times duplicated signal is described. The circuit comprises a plurality of AND gates, wherein each of the AND gates comprises a plurality of inputs for receiving a copy of the N times duplicated signal; and an OR gate having a plurality of inputs, wherein each input of the OR gate is connected to an output of one of the AND gates, wherein an output of the OR gate comprises the corrected signal.

14 Claims, 2 Drawing Sheets

VOTING CIRCUIT

BACKGROUND

A significant problem in connection with computer system operation is that of verifying and maintaining data integrity. In this regard, there are different levels of data integrity with which to be concerned. First, there is the matter of determining whether the payload of a data packet is correct; techniques such as cyclical redundancy checks ("CRC"), parity checks, and error correction code ("ECC") checks are often employed for this purpose. Second, there is the matter of determining whether the data comprising the header of a packet is correct.

If the payload of a packet is corrupted, the packet will arrive at the proper destination, at which point, upon detection of the data corruption, either the data will be corrected and the corrected data passed on to the next destination or the data will remain corrupted and the next destination will be notified of the corruption.

Corruption of header data can result in a much more serious problem. Because the header contains routing (i.e., source and destination) information, errors in the header of a packet can cause the packet to be misrouted. In any high performance computer system, the goal is to send and receive data as quickly as possible. As a result, one of the key fields of a header is the field that identifies the destination of the packet.

For example, in a large computer system with components everywhere, assume a packet originating at point A is destined for point B, but ends up at point C. This error in which a packet ends up at the wrong destination is significantly less recoverable than one in which a corrupted packet arrived at the proper destination. Additionally, when the packet is being sent from point A, there is typically not enough time to use parity or ECC techniques.

As a result of the foregoing problems, voting circuits have been developed as an alternative to performing CRC or parity or ECC checks. To use a voting circuit, multiple copies of data are created and compared at the voting circuit. If the copies all match, then it is assumed that all of them are correct. If not all of the copies match, the copy that matches the greatest number of other copies is assumed to be correct. While currently-available voting circuits provide faster data verification than CRC or parity or ECC checking, the speed with which they operate is not optimal.

SUMMARY

In one embodiment, a circuit is provided for correcting errors in a signal duplicated N times. The circuit comprises a plurality of AND gates, wherein each of the AND gates comprises a plurality of inputs for receiving a copy of the duplicated signal such that each AND gate receives as many copies of the signal as there are AND gates; and an OR gate having a plurality of inputs, wherein each input of the OR gate is connected to an output of one of the AND gates, wherein an output of the OR gate comprises the corrected signal.

DETAILED DESCRIPTION OF THE DRAWINGS

Figure 1:
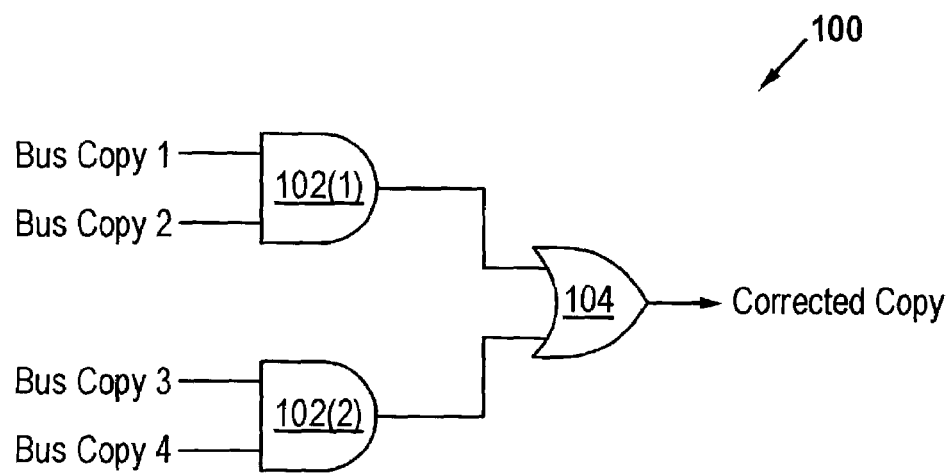
FIG. 1 is a schematic representation of a voting circuit for correcting a single bus error in accordance with one embodiment.

In the drawings, like or similar elements are designated with identical reference numerals throughout the several views thereof, and the various elements depicted are not necessarily drawn to scale.

An embodiment of the invention can be generally characterized as follows. For any N times duplicated signal, or bus, of width W bits, to resolve the correct data in a case in which:

$$N \geq 2^{(x+1)}$$

where x is the number of corrupted buses or signals a voting circuit comprises (x+1) AND gates each having (x+1) inputs (or the logical equivalent thereof) driving a single (x+1) input OR gate (or the logical equivalent thereof) will yield a correct result. It will be recognized that, in most cases, the optimal and most practical solution for N will be $N=(x+1)^2$, as it will result in a voting circuit that occupies less surface area than one that includes larger than necessary gates. As a result, N is the minimum number of copies of the signal needed for resolving x bus errors using the voting circuit embodiments described herein.

FIG. 1 illustrates an embodiment of a voting circuit 200 capable of resolving a single signal or bus error (i.e., x=1), regardless of whether such an error is a single or multi-bit error. Applying the characterization set forth above, for the voting circuit 100:

$$N=2^{(x+1)}=2^2=4$$

meaning that at least four copies of the signal or bus must be available to the voting circuit 100. It will be assumed for the sake of example that W is equal to one bit, although the embodiments described herein are equally applicable to wider buses. Accordingly, as shown in FIG. 1, the voting circuit 100 comprises (x+1) (i.e., two) AND gates 102(1)–102(2), each of which having (x+1) (i.e., two) inputs. The output of each of the AND gates 102(1)–102(2) feeds a respective one of (x+1) (i.e., two) inputs of an OR gate 104.

TABLE I

| 2-Input AND Gate | | |
|---|---|---|
| INPUTS | | OUTPUT |
| A | B | Y |
| 0 | 0 | 0 |
| 0 | 1 | 0 |
| 1 | 0 | 0 |
| 1 | 1 | 1 |

The truth table for a two-input OR gate is set forth below in Table II:

TABLE II

2-Input OR Gate

| INPUTS | | OUTPUT |
|---|---|---|
| A | B | Y |
| 0 | 0 | 0 |
| 0 | 1 | 1 |
| 1 | 0 | 1 |
| 1 | 1 | 1 |

For the case in which the correct signal data is 0, assuming that exactly one of the signals is corrupted, and therefore reflects a 1, the inputs to one of the AND gates 102(1), 102(2) are 00, while the inputs to the other one of the AND gates are 01 or 10. The outputs of both of the AND gates 102(1), 102(2), and therefore both inputs to the OR gate 104, are 0. As a result, the output of the OR gate 104 is 0, which is the correct result.

For the case in which the correct signal data is 1, assuming again that exactly one of the signals is corrupted, and therefore reflects a 0, the inputs to one of the AND gates, e.g., the AND gate 102(1), are 11, while the inputs to the other one of the AND gates, e.g., the AND gate 102(2) are 01 or 10. In this situation, the outputs of the AND gates 102(1), 102(2), respectively, and therefore the inputs to the OR gate 104, respectively, are 1 and 0. As a result, the output of the OR gate 104 is 1, which is the correct result.

It will be recognized that the voting circuit 100 is also capable of correcting two bus errors, but only in cases in which the corrupted buses are input different ones of the AND gates 102(1), 102(2). As a result, the voting circuit 100 will not reliably, and cannot be depended on to, correct more than one corrupted signal.

Figure 2:
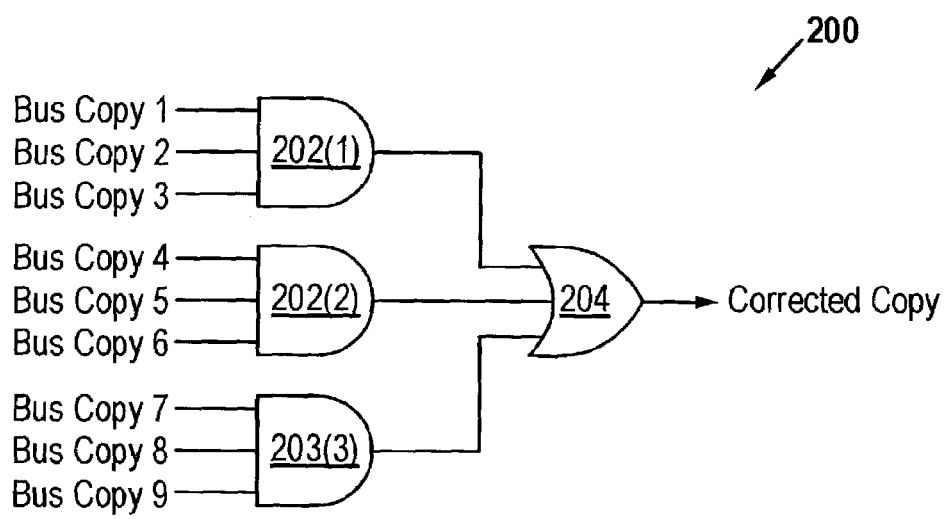
FIG. 2 is a schematic representation of a voting circuit for correcting a double bus error in accordance with one embodiment.

FIG. 2 illustrates an embodiment of a voting circuit 200 capable of resolving two simultaneous signal or bus errors. (i.e., x=2), regardless of whether such errors are single or multi-bit. Applying the characterization set forth above, for the voting circuit 200:

$$N=2^{(x+1)}2=3{,}8$$

meaning that at least eight copies of the signal or bus must be available to the voting circuit 200. It will be assumed for the sake of example that W is equal to one bit, although the embodiments described herein are equally applicable to wider buses. Accordingly, as shown in FIG. 2, the voting circuit 100 comprises (x+1) (i.e., three) AND gates 202(1)–202(3), each of which is provided with (x+1) (i.e., three) inputs. The output of each of the AND gates 202(1)–202(3) is input to a respective one of (x+1) (i.e., three) inputs of an OR gate 204.

The truth table for a three-input AND gate is set forth below in Table III:

TABLE III

3-Input AND Gate

| Inputs | | | Output |
|---|---|---|---|
| A | B | C | Y |
| 0 | 0 | 0 | 0 |
| 0 | 0 | 1 | 0 |
| 0 | 1 | 0 | 0 |
| 0 | 1 | 1 | 0 |

TABLE III-continued

3-Input AND Gate

| Inputs | | | Output |
|---|---|---|---|
| A | B | C | Y |
| 1 | 0 | 0 | 0 |
| 1 | 0 | 1 | 0 |
| 1 | 1 | 0 | 0 |
| 1 | 1 | 1 | 1 |

The truth table for a three-input OR gate is set forth below in Table IV:

TABLE IV

3-Input OR Gate

| Inputs | | | Output |
|---|---|---|---|
| A | B | C | Y |
| 0 | 0 | 0 | 0 |
| 0 | 0 | 1 | 1 |
| 0 | 1 | 0 | 1 |
| 0 | 1 | 1 | 1 |
| 1 | 0 | 0 | 1 |
| 1 | 0 | 1 | 1 |
| 1 | 1 | 0 | 1 |
| 1 | 1 | 1 | 1 |

For the voting circuit 200, assuming the maximum number of corrupted signals (in this case, two) occur, there are two possible situations with respect to the states of the inputs of the AND gates 202(1)–202(3). In the first situation, both corrupted signals are input to the same AND gate. In the second situation, the corrupted signals are input to different AND gates.

For the case in which the correct signal data is 0 (hence, the corrupted signal data is 1), assuming the first situation, in which the two corrupted signals are input to one of the AND gates, e.g., the AND gate 202(1), exists, the inputs to the AND gate 202(1) are 011, 101, or 110, while the inputs to each of the AND gates 202(2) and 202(3) are 000. The output of each of the AND gates 202(1)–202(3), and therefore each of the inputs to the OR gate 204, is 0. As a result, the output of the OR gate 204, is 0, which is the correct result. Assuming the second situation, in which the two corrupted signals are input to two different ones of the AND gates, e.g., the AND gates 202(1) and 202(2), exists, the inputs to each of the AND gates 202(1) and 202(2) are 001, 010, or 100, while the inputs to the AND gate 202(3) are 000. The output of each of the AND gates 202(1)–202(3), and therefore each of the inputs to the OR gate 204, is 0. As a result, the output of the OR gate 204 is 0, which is the correct result.

For the case in which the correct signal data is 1 (hence, the corrupted signal data is 0), assuming the first situation, in which two corrupted signals are input to one of the AND gates, e.g., the AND gate 202(1), exists, the inputs to the AND gate 202(1) are 001, 010 or 100, while the inputs to each of the AND gates 202(2) and 202(3) are 111. The output of the AND gate 202(1) is 0, while the output of each of the AND gates 202(2) and 202(3) is 1. As a result, the inputs to the OR gate 204 are 011, and the output of the OR gate 204 is 1, which is the correct result. Assuming the second situation, in which two corrupted signals are input to two different ones of the AND gates, e.g., the AND gates 202(1) and 202(2), exists, the inputs to each of the AND gates 202(1) and 202(2) are 011, 101, or 110, while the inputs to the AND gate 202(3) are 111. The output of each of the AND gates 202(1) and 202(2) is 0, while the output of the AND gate 202(3) is 1. The inputs to the OR gate 204 are 001. As a result, the output of the OR gate 204 is 1, which is the correct result.

It will be recognized that the voting circuit 200, under limited conditions, is also capable of correcting more than two bus errors, but only in cases in which no more than two corrupted buses are input to a single one of the AND gates 202(1)–202(3); if three corrupted buses are input to a single one of the AND gates, the correction fails. As a result, the voting circuit 200 will not reliably, and cannot be depended on to, correct more than two corrupted signals.

Figure 3:
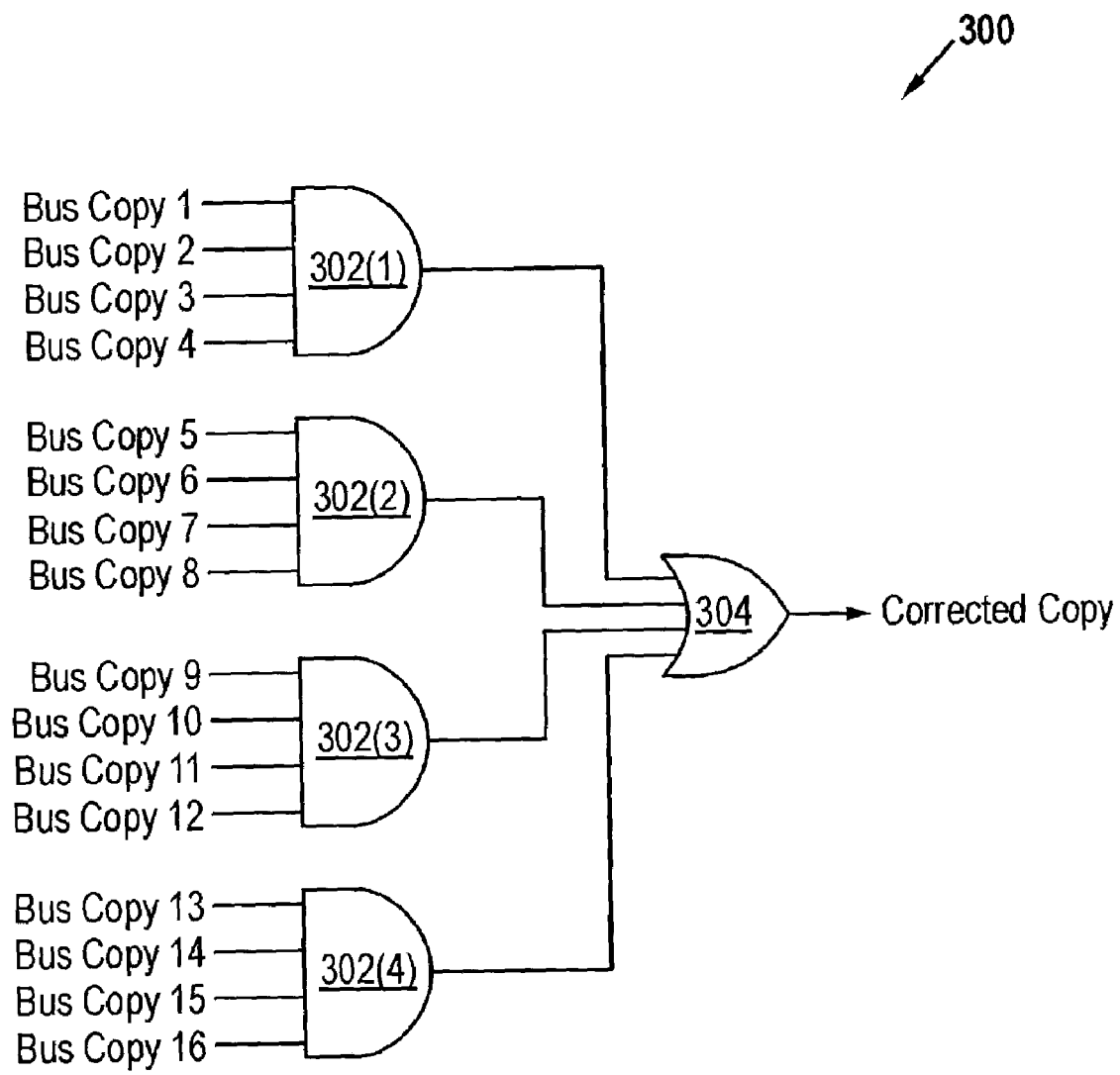
FIG. 3 is a schematic representation of a voting circuit for correcting a triple bus error in accordance with one embodiment.

FIG. 3 illustrates an embodiment of a voting circuit 300 capable of resolving three simultaneous signal or bus errors (i.e., x+3), regardless of whether such errors are single or multi-bit. Applying the characterization set forth above, for the voting circuit 300:

$$N = 2^{(x+1)} = 2^4 = 16$$

meaning that at least 16 copies of the signal or bus must be available to the voting circuit 300. It will be assumed for the sake of example that W is equal to one bit, although the embodiments described herein are equally applicable to wider buses. Accordingly, as shown in FIG. 3, the voting circuit 100 comprises (x+1) (i.e., four) AND gates 302(1)–302(4), each of which is provided with (x+1) (i.e., four) inputs. The output of each of the AND gates 302(1)–302(4) is input to a respective one of (x+1) (i.e., four) inputs of an OR gate 304.

The truth table for a four-input AND gate is set forth below in Table V:

TABLE V

| 4-Input AND Gate | | | | |
|---|---|---|---|---|
| Inputs | | | | Output |
| A | B | C | D | Y |
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 0 |
| 0 | 1 | 1 | 1 | 0 |
| 1 | 0 | 0 | 0 | 0 |
| 1 | 0 | 0 | 1 | 0 |
| 1 | 0 | 1 | 0 | 0 |
| 1 | 0 | 1 | 1 | 0 |
| 1 | 1 | 0 | 0 | 0 |
| 1 | 1 | 0 | 1 | 0 |
| 1 | 1 | 1 | 0 | 0 |
| 1 | 1 | 1 | 1 | 1 |

The truth table for a four-input OR gate is set forth below in Table VI:

TABLE VI

| 4-Input OR Gate | | | | |
|---|---|---|---|---|
| Inputs | | | | Output |
| A | B | C | D | Y |
| 0 | 0 | 0 | 0 | 0 |
| 0 | 0 | 0 | 1 | 1 |
| 0 | 0 | 1 | 0 | 1 |
| 0 | 0 | 1 | 1 | 1 |
| 0 | 1 | 0 | 0 | 1 |
| 0 | 1 | 0 | 1 | 1 |
| 0 | 1 | 1 | 0 | 1 |
| 0 | 1 | 1 | 1 | 1 |
| 1 | 0 | 0 | 0 | 1 |
| 1 | 0 | 0 | 1 | 1 |
| 1 | 0 | 1 | 0 | 1 |
| 1 | 0 | 1 | 1 | 1 |
| 1 | 1 | 0 | 0 | 1 |
| 1 | 1 | 0 | 1 | 1 |
| 1 | 1 | 1 | 0 | 1 |
| 1 | 1 | 1 | 1 | 1 |

For the voting circuit 300, assuming the maximum number of corrupted signals (in this case, three) occur, there are three possible situations with respect to the states of the inputs of the AND gates 302(1)–302(4). In the first situation, all three corrupted signals are input to the same one of the AND gates 302(1)–302(4). In the second situation, two of the corrupted signals are input to one of the AND gates 302(1)–302(4) and one of the corrupted signals is input to another one of the AND gates. In the third situation, all three of the corrupted signals are input to different ones of the AND gates 302(1)–302(4).

For the case in which the correct signal data is 0 (hence, the corrupted signal data is 1), assuming the first situation, in which all three of the corrupted signals are input to one of the AND gates, e.g., the AND gate 302(1), exists, the inputs to the AND gate 302(1) are 0111, 1011, 1101, or 1110, while the inputs to each of the AND gates 302(2)–302(4) are 0000. The output of each of the AND gates 302(1)–302(4), and therefore each of the inputs to the OR gate 304, is 0. As a result, the output of the OR gate 304, is 0, which is the correct result.

Assuming the second situation, in which two corrupted signals are input to one of the AND gates, e.g., the AND gate 302(1), and the remaining corrupted signal is input to another one of the AND gates, e.g., the AND gate 302(2), exists, the inputs to the AND gate 302(1) are 0011, 0101, 0110, 1001, 1010, 1100, the inputs to the AND gate 302(2) are 0001, 0010, 0100, or 1000, and the inputs to each of the AND gates 302(3) and 302(4) are 0000. The output of each of the AND gates 302(1)–302(4), and therefore each of the inputs to the OR gate 304, is 0. As a result, the output of the OR gate 304 is 0, which is the correct result.

Assuming the third situation, in which the three corrupted signals are input to each of three different AND gates, e.g., the AND gates 302(1), 302(2), and 302(3), exists, the inputs to each of the AND gates 302(1)–302(3) are 0001, 0010, 0100, or 1000, and the input to the AND gate 302(4) is 0000. The output of each of the AND gates 302(1)–302(4), and therefore each of the inputs to the OR gate 304, is 0. As a result, the output of the OR gate 304 is 0, which is the correct result.

For the case in which the correct signal data is 1 (hence, the corrupted signal data is 0), assuming the first situation, in which all three of the corrupted signals are input to one of the AND gates, e.g., the AND gate 302(1), exists, the inputs to the AND gate 302(1) are 0001, 0010, 0100, or 1000, while the inputs to each of the AND gates 302(2)–302(4) are 1111. The output of the AND gate 302(1) is 0, while the output of each of the AND gates 302(2)–302(4) is 1. As a result, the inputs to the OR gate 304 are 0111 and the output thereof is 1, which is the correct result.

Assuming the second situation, in which two corrupted signals are input to one of the AND gates, e.g., the AND gate 302(1), and the remaining corrupted signal is input to another one of the AND gates, e.g., the AND gate 302(2), exists, the inputs to the AND gate 302(1) are 0011, 0101, 0110, 1001, 1010, 1100, the inputs to the AND gate 302(2) are 0111, 1011, 1100, or 1110, and the inputs to each of the AND gates 302(3) and 302(4) are 1111. The output of each of the AND gates 302(1) and 302(2) is 0 and the output of each of the AND gates 302(3) and 302(4) is 1. As a result, the inputs to the OR gate 304 are 0011 and the output thereof is 1, which is the correct result.

Assuming the third situation, in which the three corrupted signals are input to each of three different AND gates, e.g., the AND gates 302(1), 302(2), and 302(3), exists, the inputs to each of the AND gates 302(1)–302(3) are 0111, 1011, 1101, OR 1110, and the inputs to the AND gate 302(4) are 1111. The output of each of the AND gates 302(1)–302(3) is 0 and the output of the AND gate 302(4) is 1. As a result, the inputs to the OR gate 304 are 0001 and the output thereof is 1, which is the correct result.

It will be recognized that the voting circuit 300, under limited conditions, is also capable of correcting more than three bus errors, but only in cases in which no more than three corrupted buses are input to a single one of the AND gates 302(1)–302(4); if four corrupted buses are input to a single one of the AND gates, the correction fails. As a result, the voting circuit 300 will not reliably, and cannot be depended on to, correct more than three corrupted signals.

It will be recognized that, for multi-bit signals, the signal is processed in the manner described above on a bit-by-bit basis.

An implementation of the invention described herein thus provides a voting circuit optimized for speed. The embodiments described herein are especially useful for data that needs to be corrected quickly, such as packet data used to route packets in a packet-switched networks, and functions much more quickly for such purposes than ECC or other voting circuit implementations. The embodiments shown and described have been characterized as being illustrative only; it should therefore be readily understood that various changes and modifications could be made therein without departing from the scope of the present invention as set forth in the following claims.

What is claimed is:

1. A circuit for correcting errors in a signal duplicated N times, wherein N is an integer greater than one, the circuit comprising:
   a plurality of AND gates, wherein each of the plurality of AND gates comprises a plurality of inputs for receiving a copy of the signal duplicated N times such that each AND gate receives as many copies of the signal as there are AND gates; and
   an OR gate having a plurality of inputs, wherein each of the plurality of inputs of the OR gate is connected to an output of a corresponding one of the AND gates,
   wherein an output of the OR gate comprises the corrected signal.

2. The circuit of claim 1 wherein N is greater than or equal to $2^{(x+1)}$, wherein x is a number of corrupted signals.

3. The circuit of claim 2 wherein the plurality of AND gates comprises x+1 AND gates.

4. The circuit of claim 3 wherein each of the plurality of AND gates comprises x+1 inputs.

5. The circuit of claim 2 wherein the OR gate comprises x+1 inputs.

6. The circuit of claim 3 wherein the value of x is one and the value of N is four.

7. The circuit of claim 3 wherein the value of x is two and the value of N is nine.

8. The circuit of claim 3 wherein the value of x is three and the value of N is sixteen.

9. A voting circuit for correcting errors in a signal duplicated N times, wherein N is greater than or equal to $2^{(x+1)}$ and x is a number of corrupted signals, the voting circuit comprising:
   a first circuit logically equivalent to a plurality of AND gates, each comprising a plurality of inputs for receiving a copy of the signal duplicated N times such that each AND gate receives as many copies of the signal as there are AND gates; and
   a second circuit logically equivalent to an OR gate having a plurality of inputs, wherein each of the plurality of inputs of the second circuit is connected to a corresponding output of an AND gate of the first circuit,
   wherein an output of the second circuit comprises the corrected signal.

10. The voting circuit of claim 9 wherein the value of x is one and the value of N is four.

11. The voting circuit of claim 9 wherein the value of x is two and the value of N is nine.

12. The voting circuit of claim 9 wherein the value of x is three and the value of N is sixteen.

13. The voting circuit of claim 9 wherein all of the x corrupted signals are input to a single one of the plurality of AND gates of the first circuit.

14. The voting circuit of claim 9 wherein fewer than all of the x corrupted signals are input to a single one of the plurality of AND gates of the first circuit.

* * * * *

UNITED STATES PATENT AND TRADEMARK OFFICE
CERTIFICATE OF CORRECTION

| | | |
|---|---|---|
| PATENT NO. | : 7,225,394 B2 | Page 1 of 1 |
| APPLICATION NO. | : 10/431941 | |
| DATED | : May 29, 2007 | |
| INVENTOR(S) | : Tyler James Johnson | |

It is certified that error appears in the above-identified patent and that said Letters Patent is hereby corrected as shown below:

In column 2, line 35, delete "200" and insert -- 100 --, therefor.

In column 3, lines 43-44, delete "$N=2^{(x+1)}2=^3\text{'}8$" and insert -- $N=2^{(x+1)}=2^3=8$ --, therefor.

In column 5, line 17, delete "(i.e., x+3)" and insert -- (i.e., x=3) --, therefor.

Signed and Sealed this

Nineteenth Day of August, 2008

JON W. DUDAS
*Director of the United States Patent and Trademark Office*